United States Patent
Mkandawire et al.

(10) Patent No.: US 9,701,330 B2
(45) Date of Patent: Jul. 11, 2017

(54) SERVER RACK LIFT

(71) Applicant: Hewlett-Packard Development Company, L.P., Houston, TX (US)

(72) Inventors: Suzie Mkandawire, Corvallis, TX (US); Alan B. Doerr, Magnolia, TX (US); John P. Franz, Houston, TX (US); Michael L. Sabotta, Houston, TX (US); Jeffery M. Giardina, Cypress, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 166 days.

(21) Appl. No.: 14/530,539

(22) Filed: Oct. 31, 2014

(65) Prior Publication Data
US 2016/0121915 A1    May 5, 2016

(51) Int. Cl.
*B62B 3/02*    (2006.01)
*B62B 5/00*    (2006.01)

(52) U.S. Cl.
CPC .............. *B62B 3/02* (2013.01); *B62B 5/0083* (2013.01)

(58) Field of Classification Search
CPC .. B66F 9/07; B66F 9/127; B66F 9/065; B66F 9/186; H05K 7/1488; B62B 3/06; B62B 3/0612; B62B 2203/10; B62B 2202/56; B65G 1/04; B65G 1/0407; B60P 1/02; B60P 1/025
See application file for complete search history.

(56) References Cited

U.S. PATENT DOCUMENTS

| | | | | |
|---|---|---|---|---|
| 2,629,609 A | * | 2/1953 | Wilson | A63B 55/60 206/315.5 |
| 2,706,057 A | * | 4/1955 | Belding | B62B 3/0612 414/459 |
| 5,673,928 A | * | 10/1997 | Jury | B62B 1/208 280/47.24 |
| 6,749,382 B2 | * | 6/2004 | Lambie | B65B 13/025 16/110.1 |
| 7,044,704 B1 | * | 5/2006 | Roose | B60P 1/025 280/43.23 |

(Continued)

FOREIGN PATENT DOCUMENTS

JP    2011195279 A    * 10/2011

OTHER PUBLICATIONS

International Business Machines Corporation, Multi-purpose fibre optics cable retention channel satisfies three separate requirements: cable routing channel, system shipping tie-down bracket, and earthquake retention system, Apr. 1998 Paper Journal, Research Disclosure Database No. RD 408136.*

(Continued)

*Primary Examiner* — Glenn Myers
(74) *Attorney, Agent, or Firm* — Brooks, Cameron & Huebsch, PLLC

(57) ABSTRACT

An example of a server rack lifting apparatus can include a first side portion, a second side portion opposing the first side portion, a back portion connecting the first side portion to the second side portion, a first lifting surface associated with the first side portion to engage a portion of a server rack, a second lifting surface associated with the second side portion to engage an opposing portion of the server rack, and a motive component to adjust a height of the first and second lifting surfaces.

14 Claims, 4 Drawing Sheets

(56) References Cited

U.S. PATENT DOCUMENTS

| | | | | |
|---|---|---|---|---|
| 7,090,457 | B2* | 8/2006 | Martin | B62B 3/00 187/241 |
| 8,505,959 | B2* | 8/2013 | Darling, III | A61G 1/013 280/640 |
| 8,925,951 | B2* | 1/2015 | Bartlett | B62D 63/06 280/414.5 |
| 2002/0071751 | A1* | 6/2002 | Brice | B62B 5/0083 414/458 |
| 2003/0221914 | A1 | 12/2003 | Smith et al. | |
| 2008/0056867 | A1 | 3/2008 | Zuckerman | |
| 2011/0006505 | A1* | 1/2011 | Wang | B62B 3/02 280/651 |
| 2012/0080984 | A1 | 4/2012 | Watts | |
| 2013/0257001 | A1* | 10/2013 | Pan | H01L 21/67724 280/47.35 |
| 2014/0199141 | A1 | 7/2014 | Bolde | |
| 2014/0203693 | A1* | 7/2014 | Wisniewski | A47B 46/005 312/249.8 |
| 2015/0151873 | A1* | 6/2015 | Luis y Prado | B65D 19/44 108/55.5 |
| 2015/0316197 | A1* | 11/2015 | Morey | B62B 3/02 280/30 |

OTHER PUBLICATIONS

SERVERLIFT, "Your Ultimate Data Center Solution", http://www.serverlift.com/solutions/products/sl1000x-server-lift/, Retrieved from the Internet Sep. 5, 2014, 4 pages.

Oracle, "Installing the System into a Rack", Oracle Database Appliance Owner's Guide, Apr. 2014, 20 pages.

* cited by examiner

SERVER RACK LIFT

BACKGROUND

Servers can be contained in server racks. Server racks may be transported, for instance, by ship, train, and/or truck on a transport device, such as a pallet. Server racks may be heavy and expensive to transport.

DETAILED DESCRIPTION

Figure 1:
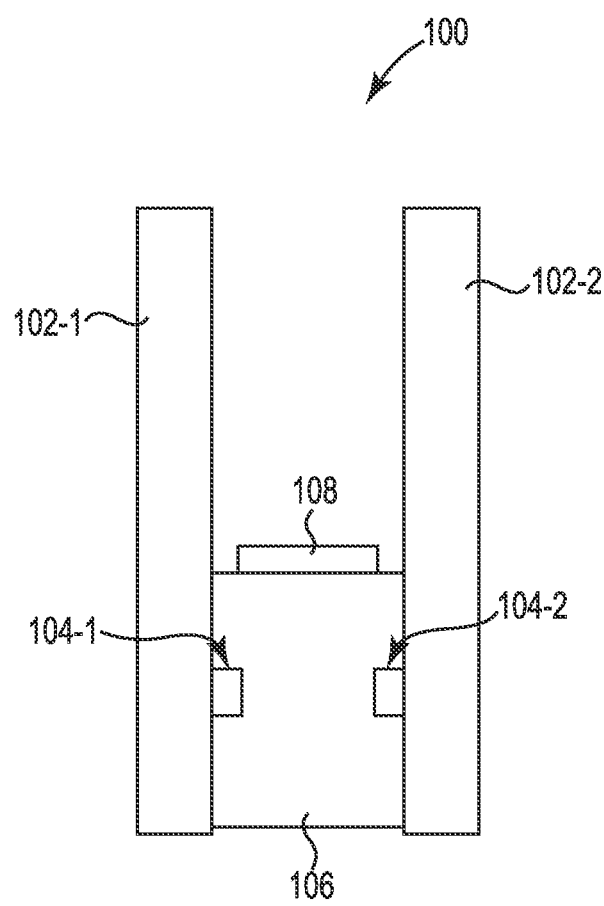
FIG. 1 illustrates a server rack lifting apparatus according to an example of the present disclosure.

Examples of the present disclosure may include lifting apparatuses and systems for moving and/or installing server racks. As referred to herein a "server rack" is a housing and/or framework designed to accept one or more hardware units. A server rack may be comprised of more than one portion. For example, some server racks may include a top portion (top half) and a bottom portion (bottom half). When multi-portion server racks are installed, the top half may be placed atop the bottom half. In such instances, either of the portions may be referred to herein as a "server rack," in some examples, or a "server rack half" in other examples.

Examples herein may include a server rack lifting apparatus capable of being transported (e.g., by ship, train, truck, etc.) on the same transport device as one of the portions (top or bottom) of a server rack (e.g., an HP Apollo 8000 server rack), thereby reducing transportation costs. A transport device, as referred to herein, is a device to which one or more items can be secured during transportation. An example of a transport device in accordance with the present disclosure is a pallet, for instance, and it is noted that though "pallet" is used herein for the purposes of discussion, the present disclosure is not so limited.

During transport, the lifting apparatus and the server rack can be nested together and secured (e.g., bolted, screwed, and/or otherwise fastened) to a pallet. Upon arrival at a destination, adjustable wheels (stored in the frame of the lifting apparatus during transportation) can be mounted on the lifting apparatus, allowing it to be elevated clear of the pallet and moved. Once moved into position to lift the rack, alignment pins on either side of the lifting apparatus can be used to engage and attach the rack to the lifting apparatus.

In some examples, the lifting apparatus is capable of lifting a 2500-pound top half of the server rack to a height of 63 inches for placement upon the bottom half of the rack, even in instances where the bottom half of the rack is atop a standard pallet (i.e., 7.35 inches tall). In some examples, the lifting apparatus is capable of lifting the fully assembled 5000-pound server rack (both top and bottom halves) up to 12 inches.

As previously discussed, examples herein can help minimize transportation costs by reducing the number of pallets used to ship a server rack and a lifting apparatus. Further, examples herein can be implemented with simple and/or minimal assembly at their destination (e.g., customer site), enhancing user satisfaction.

To streamline transport in accordance with common and/or standardized transportation practices, examples in accordance with the present disclosure (i.e., the base of examples of the present disclosure) can fit on a standard pallet (e.g., 66×40 inches). In addition, examples of the present disclosure can fit through typical doorways (42×80 inches) and into typical sea container openings (80 inches in height) when secured to the pallet.

In the following detailed description of the present disclosure, reference is made to the accompanying drawings that form a part hereof, and in which is shown by way of illustration how examples of the disclosure may be practiced. These examples are described in sufficient detail to enable those of ordinary skill in the art to practice the embodiments of this disclosure, and it is to be understood that other examples may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 102 may reference element "02" in FIG. 1, and a similar element may be referenced as 202 FIG. 2 and/or 302 in FIG. 3. Elements shown in the various figures herein can be added, exchanged, and/or eliminated so as to provide a number of additional examples of the present disclosure. In addition, the proportion and the relative scale of the elements provided in the figures are intended to illustrate the examples of the present disclosure, and should not be taken in a limiting sense.

FIG. 1 illustrates a server rack lifting apparatus 100 according to an example of the present disclosure. Server rack lifting apparatuses in accordance with examples of the present disclosure discussed herein may be generally referred to as "lifts."

In the example of FIG. 1, lift 100 includes a first side portion 102-1 opposing a second side portion 102-2 and connected to the second side portion 102-2 by a back portion 106. The first side portion 102-1 and the second side portion 102-2 may be herein referred to together as "side portions 102."

A first lifting surface 104-1 is shown associated with the first side portion 102-1, and a second lifting surface 104-2 is shown associated with the second side portion 102-2. The first lifting surface 104-1 and the second lifting surface 104-2 may be herein referred to together herein as "lifting surfaces 104." The lift 100 also includes a motive component 108, which can adjust a height of the lifting surfaces 104.

The side portions 102 can be made of metal, for instance, such as steel and/or aluminum and can include a rigid frame. The side portions 102 can include one or more vertical channels through which the lifting surfaces 104 can move. The side portions 102 can include one or more of the devices of the motive component 108 (e.g., limit switches), discussed further below. Though not illustrated in the example of FIG. 1, the side portions 102 can each include a respective base portion. In some examples, the base portions can include wheels. The wheels can be rotatable and adjustable. For instance, each of the wheels can include a crank by which a user can adjust the height of the wheels. That is, the wheels can include a bent axle, shaft, and/or arm keyed at a right angle to the end of a shaft by which circular motion is imparted to the shaft causing vertical (up or down) motion of the wheel. As discussed further below, the wheels can be transported in a "stowed" position with the lift and unpacked and affixed to the lift 100 upon arrival at a destination.

The back portion 106 can be made of metal, for instance, such as steel and/or aluminum and can include a rigid frame. The back portion 106 can include one or more of the devices of the motive component 108 (e.g., a motor), discussed further below. The back portion 106 can connect the first side portion 102-1 to the second side portion 102-2. A distance between the side portions 102 can be selected to allow a server rack to fit in an area defined by the side portions 102 and the back portion 106. In some examples, such a distance can be selected to accommodate a server rack having a width of 24 inches and a length of 56.9 inches.

The lifting surfaces 104 can be made of metal, for instance, such as steel and/or aluminum, though examples of the present disclosure are not so limited. The lifting surfaces 104 can be substantially parallel with a base of the lift 100 (i.e., horizontal). The lifting surfaces 104 can include one or more openings (e.g., holes), each adapted to receive a respective attachment device (e.g., a pin). Discussed further below, the attachment devices can allow a server rack to be attached to the lift 100. Such attachment can ensure stability and/or structural integrity of the lift 100 while it bears the weight of the server rack.

The motive component 108 can include a plurality of devices and can adjust a height of the lifting surfaces 104. Examples of the present disclosure are not limited to a particular number or configuration of devices of the motive component 108. For example, the motive component can include one or more motors, power inverters, power inverter switches (or remote controls), limit switches, lift arms, link bars, miter boxes, belts, couplers, hydraulic components, bearing assemblies, screw jacks, pistons, manual components (e.g., levers, gears, cranks), etc.

In addition, examples herein do not limit devices of the motive component to a particular location with respect to the lift 100. Such devices can be located in the side portion 102-1, the side portion 102-2, the back portion 106, the first lifting surface 104-1 and/or the second lifting surface 104-2, in addition to the example location of the motive component 108 illustrated in FIG. 1. In some examples, the operation of the motive component 108, and thus the height of the lifting surfaces 104, can be controlled by a user, for instance, through the use of an inverter switch (or inverter remote). The user can adjust the height of the lifting surfaces 104 to a desired height via inputs made to the inverter switch. Examples of the present disclosure can include redundant and/or backup motive components. In one example, a hand crank can be supplied as a backup in the event that one or more devices of the motive component 108 fail.

Figure 2:
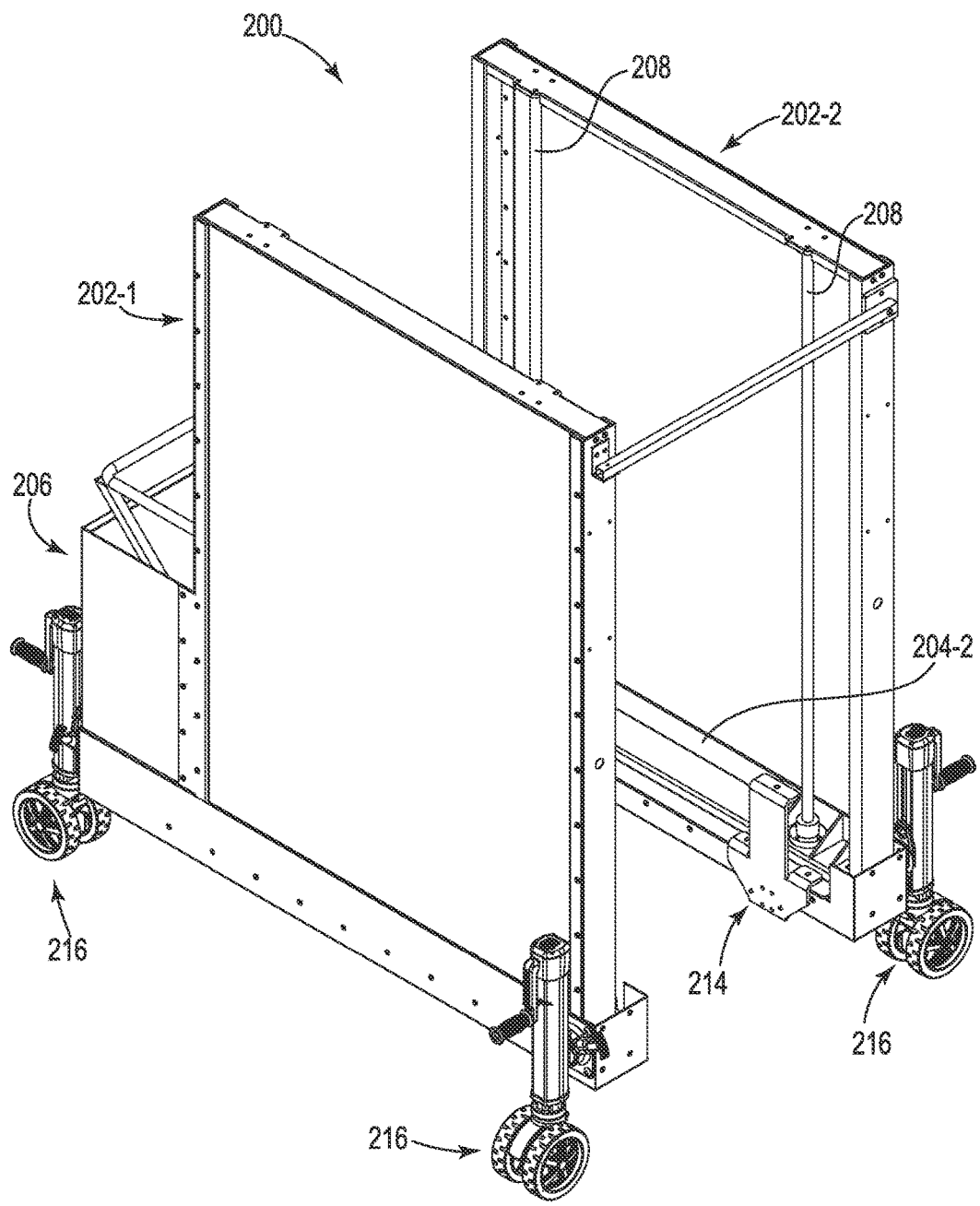
FIG. 2 illustrates a server rack lifting apparatus according to an example of the present disclosure.

FIG. 2 illustrates a server rack lifting apparatus 200 according to an example of the present disclosure. The lift 200 can be analogous to the lift 100, previously discussed in connection with FIG. 1, for instance. In the example of FIG. 2, lift 200 includes a first side portion 202-1 opposing a second side portion 202-2 and connected to the second side portion 202-2 by a back portion 206. The first side portion 202-1 and the second side portion 202-2 may be herein referred to together as "side portions 202." In some examples, and as shown in the example of FIG. 2, the side portions 202 can include wheels 216. The wheels 216 can be adjustable in height, as previously discussed in connection with FIG. 1.

The example illustrated in FIG. 2 includes a plurality of screw jacks 208 to enable a server rack to be lifted via the lifting surfaces 204 (discussed further below in connection with FIG. 3). The screw jacks 208 shown in FIG. 2 can be a portion of a motive component of the lift 200 (e.g., a motive component analogous to the motive component 108, previously described in connection with FIG. 1). Though the example illustrated in FIG. 2 includes screw jacks 208, it is again noted that the present disclosure is not limited to particular types and/or numbers of devices included in motive components.

Visible in the example of FIG. 2, is a second lifting surface 204-2. Though the lift 200 includes a first lifting surface in a manner analogous to the lift 100, previously discussed, the first lifting surface is obscured by the first side portion 202-1 in the example illustrated in FIG. 2. The lifting surfaces of lift 200 are referred to together herein as lifting surfaces 202. The lifting surfaces 202 can be attached to a server rack (discussed further below) via a plurality of brackets 214. Though only one bracket 214 is shown, examples herein include a plurality of brackets. For example, the first lifting surface can include a plurality of brackets 214 (e.g., 2 brackets) and the second lifting surface 202-2 can include a plurality of brackets 214 (e.g., 2 brackets). In some examples, the brackets 214 can be attached to opposing sides of the server rack. In other examples, the brackets 214 can be a part of the server rack. The lifting surfaces 202 can include a plurality of openings, each adapted to receive a respective attachment device (e.g., a pin). Correspondingly, the brackets 214 can include a plurality of openings, each adapted to receive a respective attachment device (e.g., a pin). The attachment devices can align one or more holes on the brackets 214 with corresponding holes on the lifting surfaces 202. Accordingly, the attachment devices in conjunction with the holes can allow attachment of the server rack 212 to the lifting surfaces 204.

In some examples, the server rack can include a first bracket 214 and a second, opposing, bracket 214, each of the brackets 214 including at least one opening. The server rack can be attached to the first lifting surface 202-1 via a first pin through the opening of the first lifting surface 202-1 and the opening of the first bracket 214, and the server rack 212 can be attached to the second lifting surface 202-2 via a second pin through the opening of the second lifting surface 202-2 and the opening of the second bracket 214.

Figure 3:
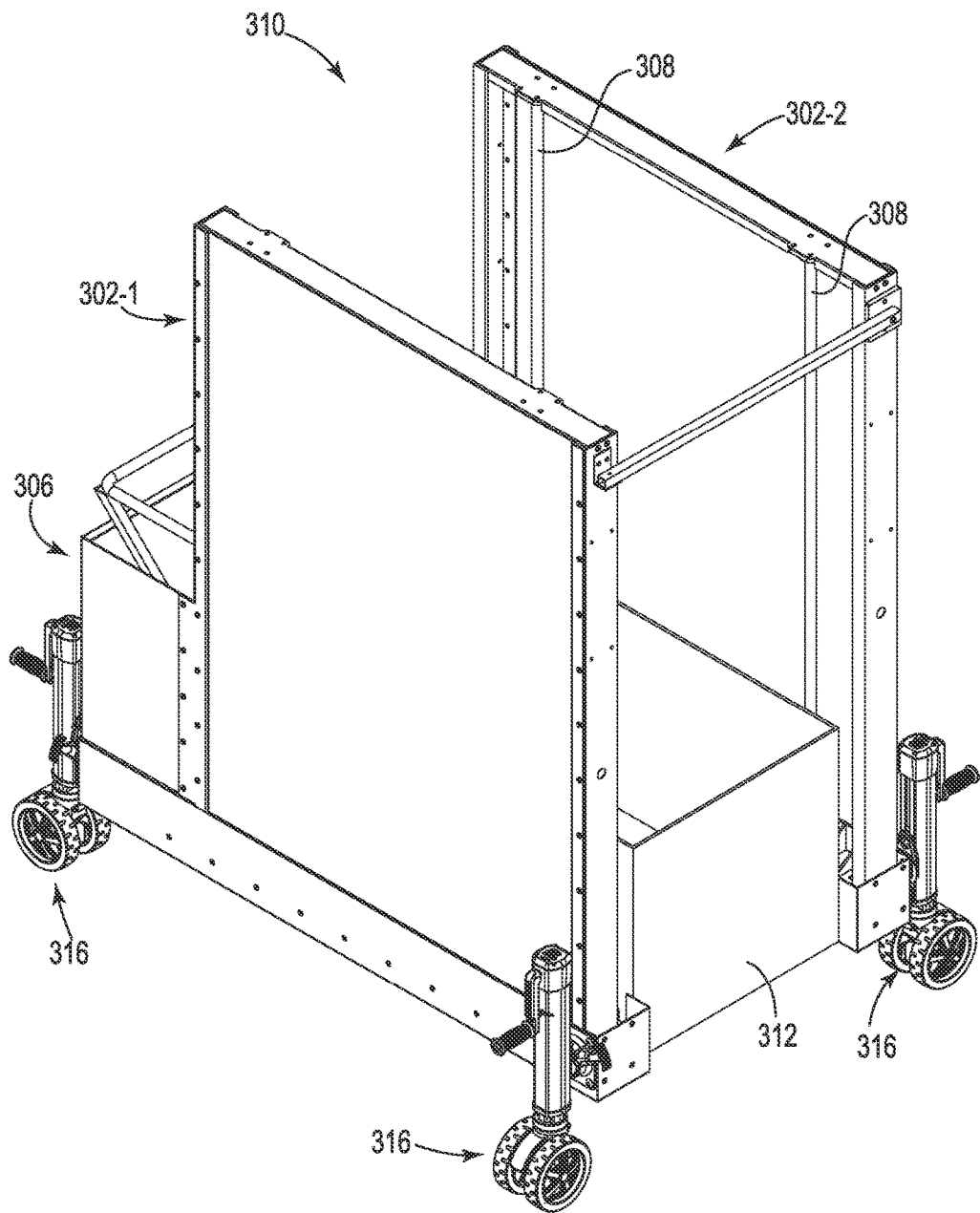
FIG. 3 illustrates a system including a server rack lifting apparatus according to an example of the present disclosure.

FIG. 3 illustrates a system 310 including a server rack lifting apparatus 300 according to an example of the present disclosure. The lift 300 can be analogous to the lifts 100 and 200, respectively discussed in connection with FIGS. 1 and 2, for instance. In the example of FIG. 3, lift 300 includes a first side portion 302-1 opposing a second side portion 302-2 and connected to the second side portion 302-2 by a back portion 306. The first side portion 302-1 and the second side portion 302-2 may be herein referred to together as "side portions 302." In some examples, and as shown in the example of FIG. 3, the side portions 302 can include wheels 316. The wheels 316 can be adjustable in height, as previously discussed.

In a manner analogous to the examples illustrated in FIGS. 1 and 2, the lift 300 can include lifting surfaces. The lifting surfaces of lift 300 can be attached to a server rack 312 via a plurality of brackets. In some examples, the brackets can be attached to opposing sides of the server rack 312. In other examples, the brackets can be a part of the server rack 312. The lifting surfaces can include a plurality of openings, each adapted to receive a respective attachment device (e.g., a pin). Correspondingly, the brackets can include a plurality of openings, each adapted to receive a respective attachment device (e.g., a pin). The attachment devices can align one or more holes on the brackets with corresponding holes on the lifting surfaces. Accordingly, the attachment devices in conjunction with the holes can allow attachment of the server rack 312 to the lifting surfaces.

That is, the server rack 312 can include a first bracket and a second, opposing, bracket, each of the brackets including at least one opening. The server rack 312 can be attached to the first lifting surface via a first pin through the opening of the first lifting surface and the opening of the first bracket, and the server rack 312 can be attached to the second lifting surface via a second pin through the opening of the second lifting surface and the opening of the second bracket.

Thus, the server rack 312 can be disposed between the side portions 302 and attached to each of the first and second lifting surfaces. Because the server rack 312 is positioned in close proximity to a center of the lift 300 (e.g., a center of mass of the lift 300), examples of the present disclosure can lift the server rack 312 without counterweighting the lift 300 (e.g., as typically seen in forklifts). Because examples herein do not include a counterweight, lifts in accordance with the present disclosure may be less cumbersome, expensive, and/or dangerous then previous approaches to lifting server racks.

Once attached, the server rack 312 can be lifted by the lift 300. The example illustrated in FIG. 3 includes a plurality of screw jacks 308 to enable the server rack 312 to be lifted via the lifting surfaces 304. The screw jacks 308 shown in FIG. 3 can be a portion of a motive component of the lift 300 (e.g., a motive component analogous to the motive component 108, previously described in connection with FIG. 1). Though the example illustrated in FIG. 3 includes screw jacks 308, it is again noted that the present disclosure is not limited to particular types and/or numbers of devices included in motive components.

In some examples, the server rack 312 can have a weight of between 2200 and 3000 pounds (e.g., approximately 2500 pounds). The lift 300 can adjust a height of the lifting surfaces such that the server rack 312 can travel from 0 to 63 inches above the base of the lift 300 (e.g., above the ground or floor). Once the server rack 312 is elevated, the lift 300 can be moved via the wheels 316. A user can move the server rack to a desired position for installation. In some examples, the server rack 312 can be lowered and installed on a floor. In other examples, the server rack 312 can be lowered and installed upon an installation base, such as a pallet, for instance (e.g., 7.35 inches above ground). In other examples, the server rack 312 can be lowered and installed upon another server rack (e.g., a bottom half of the server rack (54.8 inches above ground)). In other examples, the server rack 312 can be lowered and installed upon another server rack (e.g., bottom half of server rack) atop an installation base (e.g., 62.15 inches above ground).

Figure 4:
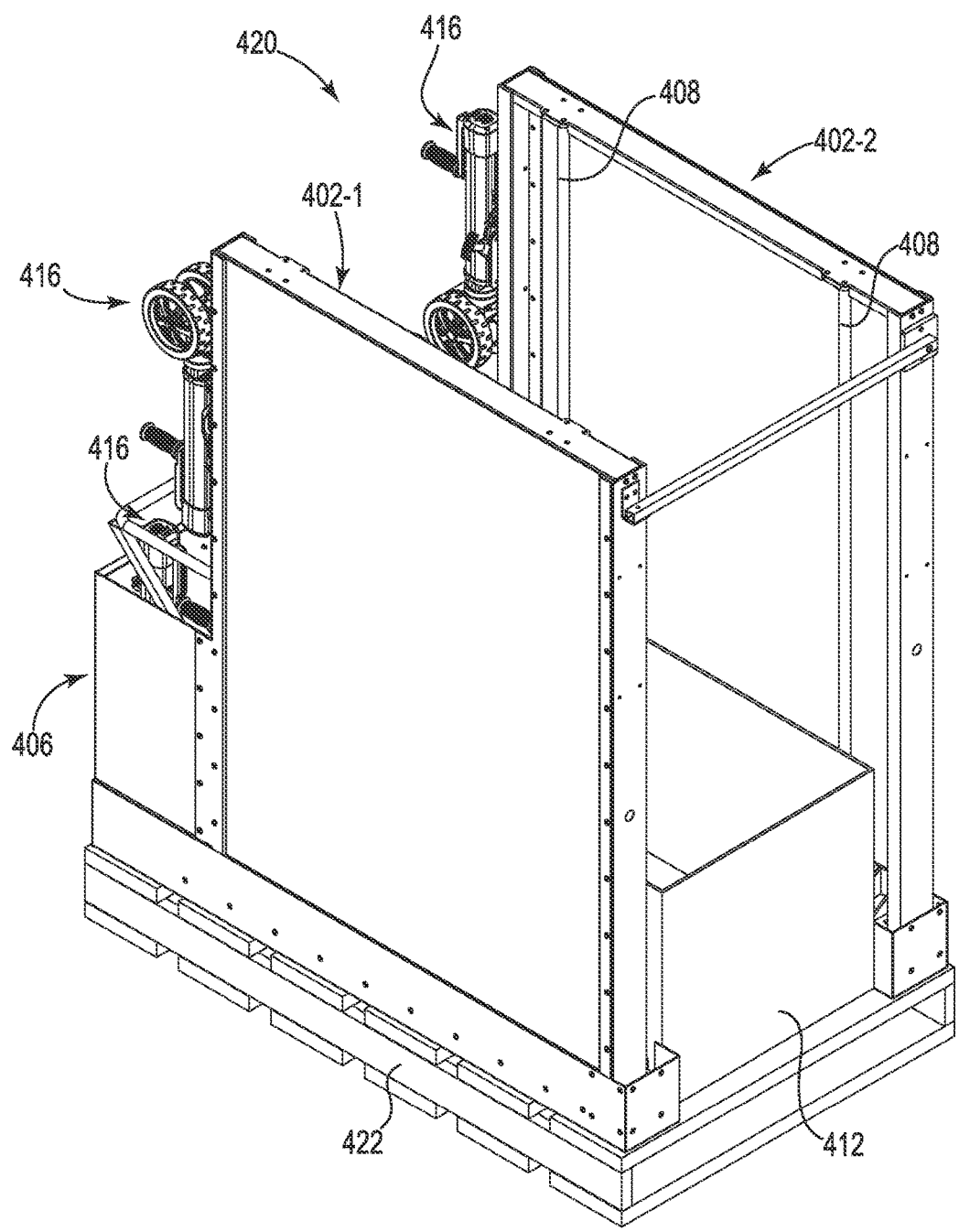
FIG. 4 illustrates another system including a server rack lifting apparatus according to an example of the present disclosure.

FIG. 4 illustrates another system 420 including a server rack lifting apparatus 400 according to an example of the present disclosure. The screw jacks 408 shown in FIG. 4 can be a portion of a motive component of the server rack lifting apparatus 400 (e.g., a motive component analogous to the motive component 108, previously described in connection with FIG. 1, analogous to the motive component 208, previously described in connection with FIG. 2, and analogous to the motive component 308, previously described in connection with FIG. 3). The example of FIG. 4 illustrates the lift 400 in a transport configuration, for instance.

In the example of FIG. 4, lift 400 includes a first side portion 402-1 opposing a second side portion 402-2 and connected to the second side portion 402-2 by a back portion 406. The first side portion 402-1 and the second side portion 402-2 may be herein referred to together as "side portions 402." In some examples, and as shown in the example of FIG. 4, the lift 400 can include wheels 416. As shown in the example of FIG. 4, the wheels 416 can be attached to a frame of the lift 400. In some examples, one or more of the wheels 416 can be attached to the first side portion 402-1, the second side portion 402-2, and/or the back portion 406.

The lift 400 can fit on a surface (e.g., a major surface) of a transport device 422. That is, a base of the lift 400 fits within the surface of the transport device 422 and does not overlap an edge of the transport device 422. As previously discussed, the transport device can be a pallet, for instance, and is herein referred to as "pallet 422," though examples herein are not so limited. The lift 400 can be bolted to the pallet 422, for instance. In the transport configuration example illustrated in FIG. 4, a server rack 412 can be "nested" inside the lift 400 and also secured (e.g., bolted) to the pallet 422. That is, the server rack 412 can be secured to the pallet 422 and positioned interior to the first side portion 402-1, the second side portion 402-2, and the back portion 406 of the lift 400. Accordingly, a base of the server rack 412 can simultaneously fit on the same surface of the pallet 422 as the lift 400. As shown, the lift 400 can be secured to the transport device 422.

As previously discussed, the transport configuration of the lift 400 can arrive at a destination and can be converted to a lifting configuration such as the configurations illustrated in FIGS. 2-3. That is, the wheels 416 can be removed from their "stowed" positions illustrated in FIG. 4 and attached to the base of the lift 400. The lift 400 can be detached from the pallet 422 and the wheels 416 can adjust in height and elevate the lift 416 above the pallet 422. The server rack 412 can be detached from the pallet 422 and attached via one or more brackets to the lift 400 where it can be lifted by the lift 400 and placed in a desired position.

Although specific examples have been illustrated and described herein, those of ordinary skill in the art will appreciate that an arrangement calculated to achieve the same results can be substituted for the specific examples shown. This disclosure is intended to cover adaptations or variations of one or more examples of the present disclosure. It is to be understood that the above description has been made in an illustrative fashion, and not a restrictive one. Combination of the above examples, and other examples not specifically described herein will be apparent to those of skill in the art upon reviewing the above description. The scope of the one or more examples of the present disclosure includes other applications in which the above structures and methods are used. Therefore, the scope of one or more examples of the present disclosure should be determined with reference to the appended claims, along with the full range of equivalents to which such claims are entitled.

What is claimed:
1. A system, comprising:
  a server rack lifting apparatus, comprising:
    a first side portion;
    a second side portion opposing the first side portion;
    a back portion connecting the first side portion to the second side portion;
    a first lifting surface associated with the first side portion to engage a portion of a server rack;
    a second lifting surface associated with the second side portion to engage an opposing portion of the server rack;

a motive component to adjust a height of the first and second lifting surfaces, wherein the motive component includes an electric motive component and a redundant physical motive component and the height is adjustable by a particular amount via at least one input made to an inverter switch of the motive component; and a plurality of wheels to:
attach in a stowed position to a frame of the server rack lifting apparatus for transport; and
attach to a base of the server rack lifting apparatus to adjust a height of the server rack and the server rack lifting apparatus above an installation base.

2. The system of claim 1, wherein the motive component includes a motor.

3. The system of claim 1, wherein a height of each of the plurality of wheels is adjustable.

4. The system of claim 1, wherein the apparatus does not include a counterweight.

5. The system of claim 1, wherein the motive component is configured to adjust the height while the first and second lifting surfaces are attached to the server rack.

6. The system of claim 5, wherein a weight of the server rack is between 2200 and 3000 pounds.

7. The system of claim 6, wherein the motive component is to adjust the height to a height of 63 inches.

8. The system of claim 1, wherein a base of the server rack lifting apparatus fits on a surface of a transport device, and wherein a base of the server rack simultaneously fits on the same surface of the transport device.

9. A system, comprising:
a server rack lifting apparatus, including:
a first side portion;
a second side portion opposing the first side portion;
a back portion connecting the first side portion to the second side portion;
a first lifting surface associated with the first side portion;
a second lifting surface associated with the second side portion; and
a motive component to adjust a height of the first and second lifting surfaces, wherein the motive component includes an electric motive component and a redundant physical motive component and the height is adjustable by a particular amount via at least one input made to an inverter switch of the motive component;
a server rack disposed between the first and second side portions and attached to each of the first and second lifting surfaces; and
a plurality of wheels to:
attach in a stowed position to a frame of the server rack lifting apparatus for transport; and
attach to a base of the server rack lifting apparatus to adjust a height of the server rack and the server rack lifting apparatus above an installation base.

10. The system of claim 9, wherein the first and second lifting surfaces each include at least one opening.

11. The system of claim 10, wherein the server rack includes a first bracket and a second, opposing, bracket, each including at least one opening.

12. The system of claim 11, wherein:
the server rack is attached to the first lifting surface via a first pin through the opening of the first lifting surface and the opening of the first bracket, and
the server rack is attached to the second lifting surface via a second pin through the opening of the second lifting surface and the opening of the second bracket.

13. A system, comprising:
a server rack lifting apparatus, including:
a first side portion;
a second side portion opposing the first side portion;
a back portion connecting the first side portion to the second side portion; and
a motive component to adjust a height of first and second lifting surfaces, wherein the motive component includes an electric motive component and a redundant physical motive component and the height is adjustable by a particular amount via at least one input made to an inverter switch of the motive component;
a server rack;
a plurality of wheels to:
attach in a stowed position to a frame of the server rack lifting apparatus for transport; and
attach to a base of the server rack lifting apparatus to adjust a height of the server rack and the server rack lifting apparatus above an installation base; and
a transport device;
wherein the server rack lifting apparatus is positioned on the transport device, and wherein the server rack is positioned interior to the first side portion, the second side portion, and the back portion of the server rack lifting apparatus.

14. The system of claim 13, wherein the plurality of wheels is attached to the first side portion and the second side portion of the server rack lifting apparatus.

\* \* \* \* \*